United States Patent [19]

Slodzian

[11] Patent Number: 4,748,325
[45] Date of Patent: May 31, 1988

[54] METHOD AND DEVICE TO DISCHARGE SAMPLES OF INSULATING MATERIAL DURING ION ANALYSIS

[75] Inventor: Georges Slodzian, Sceaux, France

[73] Assignee: Cameca, Courbevoie, France

[21] Appl. No.: 72,867

[22] Filed: Jul. 14, 1987

[30] Foreign Application Priority Data

Jul. 23, 1986 [FR] France ............................. 86 10681

[51] Int. Cl.4 ............................................. G01N 23/22
[52] U.S. Cl. ..................................... 250/309; 250/282
[58] Field of Search .................... 250/309, 492.21, 282

[56] References Cited

FOREIGN PATENT DOCUMENTS 0104818 4/1984 European Pat. Off. .

OTHER PUBLICATIONS

Patent Abstracts of Japan, vol. 9, #274–10/31/85, Shimazu Seisakusho, K. K–Ion Apparatus Device.
Patent Abstracts of Japan, vol. 7, #162, 7/15/83, Fujitsu, K. K–Ion Implementation Device.
Patent Abstracts of Japan; vol. 7, #243, 10/28/83, Fujitsu, K. K–Irradiation of Energy Rays.

*Primary Examiner*—Carolyn E. Fields
*Assistant Examiner*—John A. Miller
*Attorney, Agent, or Firm*—Roland Plottel

[57] ABSTRACT

To compensate for the charges created during the bombardment of a sample of insulating material, positively polarized by a beam of positive, primary ions, the method uses the secondary electrons emitted by the acceleration electrode under the impact of particles, emitted by the sample, which have not passed through the hole provided in this electrode for analysis. For this, an additional electrode, having a hole of a diameter greater than that of the acceleration electrode and carried to a potential which is greater than that of the same electrode by about 100 volts, is placed between the sample and this electrode, near the latter, to focus the secondary electrons on the imaged field of the sample.

7 Claims, 2 Drawing Sheets

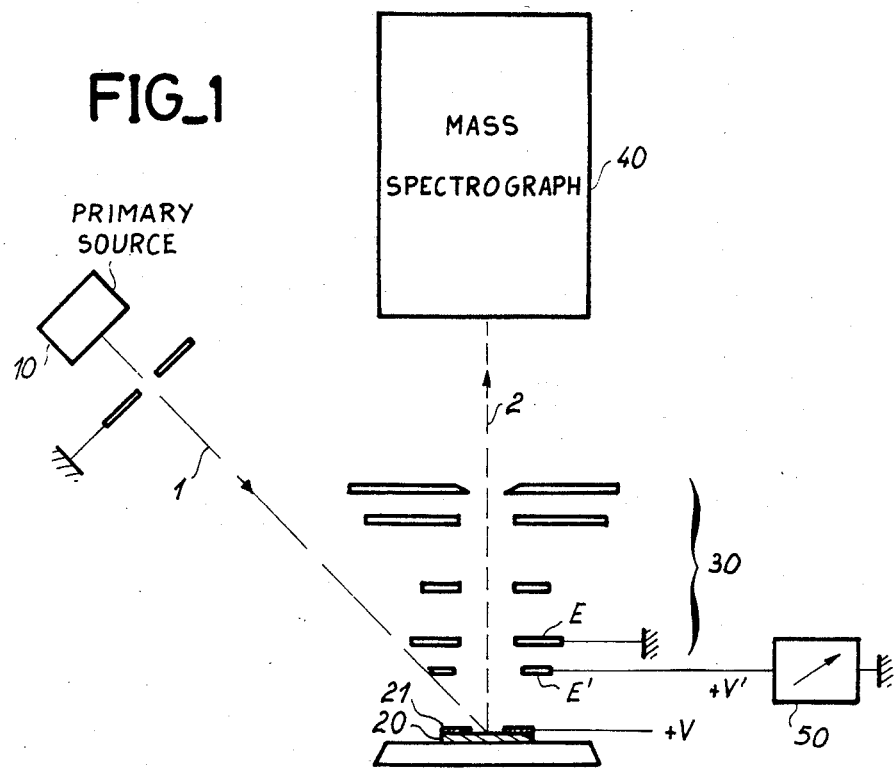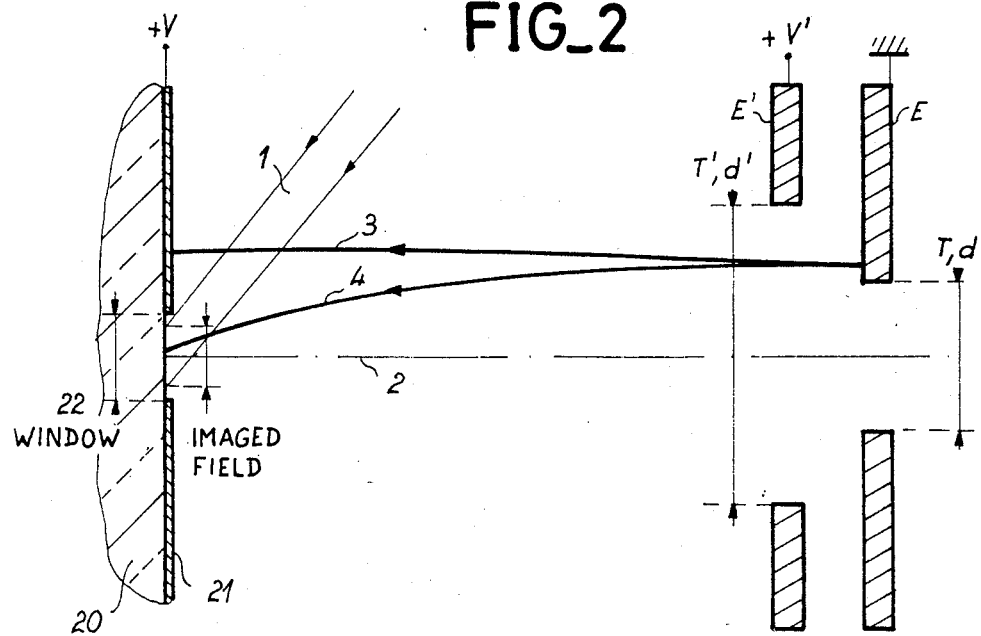

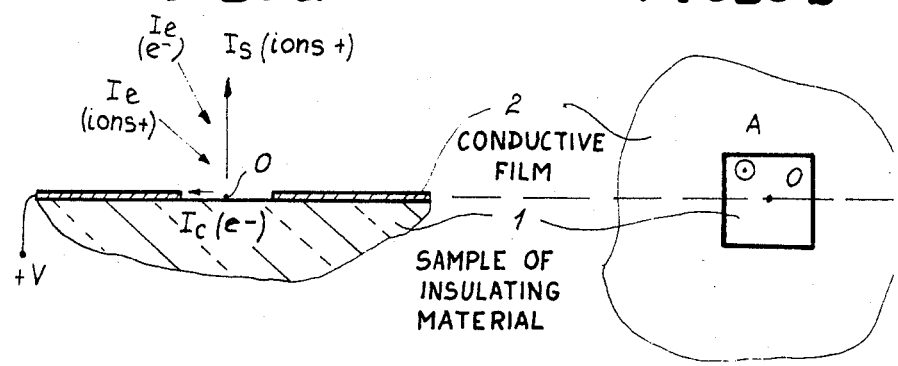
FIG_3a
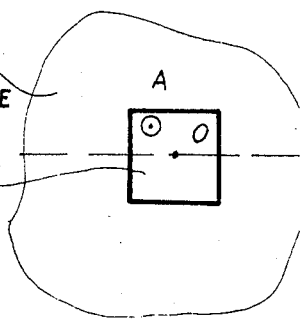
FIG_3b
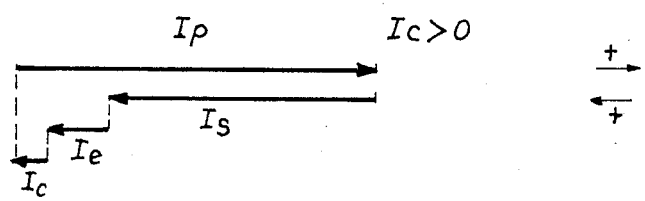
FIG_4a
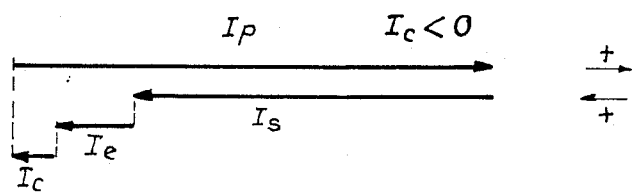
FIG_4b

METHOD AND DEVICE TO DISCHARGE SAMPLES OF INSULATING MATERIAL DURING ION ANALYSIS

BACKGROUND OF THE INVENTION

1. Field of the Invention

The invention pertains to ion analyzers, and more especially to the ion analysis of samples of insulating material.

Ion analyzers are habitually used for the analysis of solid samples. If the elements to be analyzed emit negative ions, the sample is negatively polarized and the negative ions emitted are analyzed. However, if these elements emit positive ions, then the sample must be positively polarized and it is the positive ions which can then be analyzed. For the samples in which insulating zones are formed, or for samples of insulating material, the emission of charged particles creates a surface charge on the surface of the sample which must be compensated for to obtain suitable images of the sample.

2. Description of the Prior Art

A method and a device for the ion analysis of samples of insulating material from negative secondary ions emitted by the sample is known through the French patent application No. 83 00538, filed on Jan. 14, 1983. The method for discharging the imaged field and the corresponding device consist in directing, towards the analyzed surface, the beam of primary ions to be analyzed as well as an auxiliary beam of electrons which exactly compensates for the positive charges which tend to be created on the surface of the sample and to disturb the images if no method is used to neutralize them.

For the analysis of samples of insulating material, an operation in which the analysis is based on the positive secondary ions created during ion bombardment, the target is positively polarized to push back these positive secondary ions created by the impact of the primary beam. One approach, similar to the one described above for analysis based on negative ions, would consist in replacing the auxiliary beam of electrons by an auxiliary monokinetic beam of positive ions: but this approach is not worthwhile for it entails an excessively complicated assembly owing to the fact that the magnetic field which would bring this ancillary beam to the axis of the ionic emission lens would have to be far more intense than the one used previously, and because its effect on the secondary ions could no longer be compensated for as easily. Furthermore, the surface of the insulating material would need to possess the tendency of developing, in all circumstances, a negative charge during the ion bombardment. However, this is not the case when the ion bombardment is done with positive primary ions. To obtain a compensation, it would therefore be necessary to bombard the surface of the sample either with fast neutral atoms or with negative ions, or again, it would be necessarhy to have an additional auxiliary beam of electrons. However, the system would then become more complicated.

Other methods have been proposed, all pertaining to the analysis of the positive ions emitted by the target: a metallic grid is deposited by evaporation on the surface. In addition to the beam of primary ions, the insulating zones of the sample receive secondary low-energy electrons emitted by the grid and high-energy electrons produced on the acceleration electrode and attracted by the sample.

This low electronic flux on the imaged field can, however, be used for the compensation provided that the bombardment density of the primary ions is sufficiently lowered while the total intensity of the beam of primary ions on the target is kept constant. It is then possible to obtain a state of electrical equilibrium, where the insulating surface is practically equipotential and where the difference in potential compared with the conductive film is virtually zero, by modulating the density of the beam of primary ions in the imaged field. This lowering has disadvantages as the secondary ion currents used for imaging are then low. Furthermore, the adjustment of the density of the primary beam is a delicate task since it is obtained only by making variations in the focusing of the beam of primary ions by affecting the excitation of the capacitors: however, since there are diaphragms in the primary column, this operation may also alter the total intensity of the primary beam reaching the target. Finally, the zone bombarded is unnecessarily increased and, furthermore, the new regions affected may emit in a different way, causing a modification in the flow of secondary electrons which tends to increase the adjusting difficulty.

The object of the invention is a method and corresponding device for the ion analysis of samples of insulating material, suited to the case where the image is formed from positive secondary ions, a method and device which do not have the disadvantages referred to above.

3. Summary of the Invention

The invention relates to a method for the ion analysis of samples of insulating material where positive ions are emitted under the impact of a primary bombardment beam of positive ions, these positive ions being accelerated by an electrostatic field created in an accelerating space between an acceleration electrode and the sample taken to a very positive potential as compared to this electrode, method wherein the positive charge created in the imaged field of the sample is compensated for by secondary electrons emitted by the acceleration electrode under the impact of particles transmitted by the sample, focusing means being provided in the acceleration space to send back the exact quantity of secondary electrons needed for compensation to the imaged field.

The object of the invention is also a device for the ion analysis of samples of insulating material, used to analyze positive ions emitted by the imaged field of the sample under the impact of a beam of positive primary ions, device comprising a source of primary ions, a primary column to bring these primary ions to the imaged field of the sample, a collecting device comprising especially an acceleration electrode and a mass spectrometer, further comprising an additional electrode placed between the collecting device and the sample, and capable of being polarized at an intermediate voltage between that of the acceleration electrode and that of the sample, and means to set this intermediate voltage.

BRIEF DESCRIPTION OF THE DRAWINGS

The invention will be better understood and other characteristics will become clear from the following description, made with reference to the appended figures of which:

FIG. 1 is a simplified block diagram of the ion analysis device according to the invention;

FIG. 2 is a detailed diagram illustrating the device according to the invention;

FIGS. 3a and 3b give a cross-section and top view of the sample and distribution of charges, as well as the currents induced;

FIGS. 4a and 4b are explanatory, vectorial diagrams.

DESCRIPTION OF THE PREFERRED EMBODIMENT

Before making a precise description of the object of the invention, we shall describe the essential elements of the analyzer with reference to FIG. 1. This analyzer comprises a source of primary ions 10, positively polarized at 10 kV for example, bombarding a primary ion beam 1 on a target on the surface of an sample of insulating material 20, the plane and polished section of which is coated with a conductive film 21 in which a window 22 has been opened so as to bare the surface of the insulating material. The conductive film 21 is taken to a voltage +V. A collecting device 30 made up of a set of electrostatic lenses especially comprises an acceleration electrode E carried to neutral. A mass spectrograph 40, not described here, does the analysis. The flow of positive secondary ions produced at the surface of the target by this bombarding process is accelerated by the electrostatic field created between the electrode E and the sample along the axis 2. These positive ions produced escape from the acceleration space by a circular hole T drilled in the electrode E. This electrode E is itself also bombarded by a flow of particles from the target: for the target emits positive ions, sends back backscatteed ions or backscattered atoms as well as neutral atoms wrenched off the surface by ionic bombardment. The electrode is also struck by secondary ions emitted by the surface with excessively high initial energies and in directions which diverge far too much off the perpendicular direction to pass through the hole T. A certain number of these particles have an impact energy which is sufficient to produce secondary electrons at the surface of the electrode E. These electrons are then attracted by the object since the latter is positively polarized.

One advantage characteristic of the flow of particles (coming from the electrode E) which strike the electrode E is that the said flow is proportionate to the flow of positive primary ions to be analyzed. The same applies to the flow of secondary electrons produced by this electrode, which is thus also proportionate to the flow of primary ions. The secondary electrons are sent to the object but in any direction, and only a small number of these electrons reach the imaged field. For this imaged field is centered on the axis of the system and, hence, on the axis of the hole T drilled in the electrode E, and its diameter exceptionally reaches 0.4 mm. i.e., it is generally smaller than the diameter of the hole T which generally ranges between 1.5 mm. and 1.5 mm. The secondary electrons emitted by the electrode E on the periphery of the hole T, perpendicularly to the said electrode, strike the sample outside the imaged field. Calculations show that, for the electrons to reach the center of the imaged field, they should be emitted in a direction which forms a wide angle with the perpendicular, and that they should be emitted with a relatively high energy of about 10 electronvolts. Now, secondary electrons have an energy distribution where the maximum is a few electronvolts. Consequently, the flow of electrons on the imaged field is far smaller than the total flow which returns to the sample.

To discharge the insulating surface of the sample in the imaged field, the invention uses the secondary electrons emitted by the electrode E, by placing means (for example electrostatic means) to focus these secondary electrons towards the image field between the electrode E and the sample, by placing an electrode E', parallel to E, the said electrode E' being drilled with a circular hole T' centered on the same axis as T, but with a diameter which is greater than that of T. The electrode E' is taken to an adjustable potential by means of an adjustable voltage source 50 so that the secondary electrons emitted by the electrode E on a circular ring surrounding the hole T are focused in varying degrees towards the imaged field. FIG. 2 gives a more detailed view of the sample, the electrodes E and E' and the acceleration space. In the absence of the electrode E', the path of the secondary electrons emitted by the electrode E can be the path marked 3 in FIG. 2. However, for a voltage V' applied to the electrode E', the path of the electron is modified and may be the path marked 4. Thus, compared with prior systems, a far greater proportion of secondry electrons emitted by the electrode E can be used to discharge the sample of insulating material. The density of this flow of electrons can be adjusted by controlling the voltage applied to the electrode E, thus making for easier setting; for a given density of primary ion beam, the adjustment is got by acting on the voltage applied to the electrode E' until an insulating surface is obtained that is almost equipotential between the conductive film and the imaged window.

FIGS. 3a and 3b show cross-section and top views respectively of the sample 20, coated with the conductive film 21 in which the window 22 has been formed and the flows of particles received and emitted.

In the conductive film 21, the impact energy of the electron bombardment depends on the positive potential V to which the object is carried. In the absence of compensation on the insulating surface, the electrostatic potential is not constant. Since that the said electrostatic potential is less than V everywhere, the impact energy Y is weaker than on the conductor. At the point 0, which is the center of the insulating area, the difference in potential between the conducting film and the insulant is at its maximum. The value of this difference depends on the geometrical configuration, i.e. it depends on whether it is solid insulant, a thin film insulant on a conductive support etc.

We shall now consider a small area surrounding a point A of the insulating surface in FIG. 3b. This small area receives a current $I_p$ of positive primary ions and an electronic compensation current $I_e$. It emits a current $I_s$ of positive particles and discharges a current $I_c$ by conduction towards the film: $I_c = I_p - I_s - I_e$. According to the invention, the electron flow $I_e$ is made proportionate to the flow of primary ions $I_p$.

FIGS. 4a and 4b are two vectorial diagrams showing how the compensation is done at a constant control voltage V' when the intensity of the primary beam varies. The equilibrium is not modified with $I_p$, $I_e$ and $I_s$, and $I_c$ varying in the same proportions.

Of course, the discharge of the sample of insulating material by the means described above can be used only if the number of positive ions leaving the surface is smaller than the number of positive primary ions reaching the target. In a situation where the number of positive ions leaving the surface is greater than the number of positive primary ions reaching the target, it would be necessary to change the nature or energy of the primary ions to restore the balance. This exceptional situation is not likely to occur frequently.

Moreover, if the electron bombardment induces low conductivity on the surface of the sample, it may be impossible to achieve an equipotential insulating surface. In this case, it may even be difficult to achieve electrical equilibrium owing to the difficulty in adjusting the excitation of the additional electrode E' to make the electron flow compensate exactly for the difference between the incoming flow of primary ions and the outgoing flow of the positive ions emitted, the secondary ions and the backscattered ions. The conductivity induced therefore remains necessary to restore equilibrium. Of course, the closer we get to the exact degree of compensation, the smaller is the effect of the conductivity, so that even a low conductivity may be sufficient. However, there is a difficulty that persists owing to the fact there is a transitional period during which the compensation is not achieved and when there is a risk of major deviations which may quickly cause breakdowns.

To resolve this problem, it is possible to carry out a prior adjusting stage by using a very low density beam of primary ions. This approach cannot be used to obtain high signals but makes it possible to obtain the state of equilibrium by adjusting the excitation of the additional electrode E'. Owing to the fact that the beam of secondary electrons emitted by the electrode E is proportionate to the beam of primary ions and hence, to the charge, the density of the primary ion bombardment can be increased from the point of equilibruim onwards, without this equilibruim being modified.

The invention is not limited to the mode of embodiment precisely described herein: in particular, it is possible to replace the electrostatic focusing system, using the additional electrode E', by a magnetic focusing system. For there may be a disadvantage in the fact that the secondary ions emitted by the additional electrode are also focused on the sample at the same time as the electrons are focused through electrostatic focusing. This is especially the case if oxygen ions are emitted by the additional electrode and if it is sought to measure the oxygen ions of the sample. For the electrostatic focusing arts in the same way on the ions and the electrons.

If a different effect is sought, the device will use a magnetic focusing system, the additional electrode made of stainless steel will be replaced by a soft iron electrode taken to neutral instead of the potential V' associated with a small coil to form a small magnetic lens which performs a magnetic forcusing operation that acts differently on ions and electrons.

What is claimed is:

1. A method for the ion analysis of samples of an insulating material where positive ions are emitted under the impact of a primary bombardment beam of positive ions, these positive emitter ions being accelerated by an electrostatic field created in an acceleration space between an accelerating electrode and the sample taken to a very positive potential as compared to this electrode, method wherein the positive charge created in the imaged field of the sample is compensated for by secondary electrons emitted by the accelerating electrode under the impact of particles emitted by the sample, focusing means placed in the acceleration space being used to send back to the imaged field the exact quantity of secondary electrons needed for charge neutralization.

2. A method according to the claim 1, wherein the focusing means are electrostatic means and comprise an additional electrode.

3. A method according to the claim 2, wherein the potential applied to the additional electrode can be adjusted to cause variations in the quantity of secondary electrons sent to the imaged field of the sample and to exactly compensate for the positive charges created on its surface.

4. A method according to the claim 3, wherein the voltage applied to the additional electrode is adjusted with a low intensity bombardment primary beam, the intensity of the primary beam being subsequently increased to the value needed for analysis without any modification in the setting of the potential of the additional electrode, the flow of secondary electrons sent to the imaged field being proportionate to the flow of primary ions, as it is to the quantity of charges to be compensated.

5. A method according to the claim 1, wherein the focusing means are magnetic and comprise a soft iron electrode set to neutral and associated with an inductance coil.

6. A device for the ion analysis of samples of an insulating material by the analysis of positive ions emitted by the imaged field of the sample under the impact of a beam of positive primary ions, comprising a source of primary ions, a primary column to bring these primary ions to the imaged field of the sample, a collecting device comprising an acceleration electrode and a mass spectrograph, the device further comprising an additional electrode placed between the collecting device and the sample and being set to a voltage which is between that of the acceleration electrode and that of the sample, and means to adjust this voltage for the electrostatic focusing of secondary electrons emitted by the acceleration electrode towards the imaged field.

7. A device for the ion analysis of samples of an insulating material, by the analysis of the positive ions emitted by the imaged field of the sample under the impact of a beam of positive primary ions, comprising a source of primary ions, a primary column to bring these primary ions to the imaged field of the sample, a collecting device comprising an acceleration electrode and a mass spectrograph, the device further comprising an additional electrode made of soft iron set to neutral and associated with an inductance coil forming a means for the magnetic focusing of secondary electrons emitted by the acceleration electrode towards the imaged field.

* * * * *